United States Patent
Kuczynski et al.

(10) Patent No.: US 9,257,359 B2
(45) Date of Patent: Feb. 9, 2016

(54) SYSTEM AND METHOD TO PROCESS HORIZONTALLY ALIGNED GRAPHITE NANOFIBERS IN A THERMAL INTERFACE MATERIAL USED IN 3D CHIP STACKS

(75) Inventors: Joseph Kuczynski, Rochester, MN (US); Arvind K. Sinha, Rochester, MN (US); Kevin A. Splittstoesser, Stewartville, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/188,572

(22) Filed: Jul. 22, 2011

(65) Prior Publication Data
US 2013/0020716 A1    Jan. 24, 2013

(51) Int. Cl.
*H01L 23/48* (2006.01)
*H01L 21/50* (2006.01)
(Continued)

(52) U.S. Cl.
CPC .............. *H01L 23/36* (2013.01); *H01L 23/373* (2013.01); *H01L 23/42* (2013.01); *H01L 23/4275* (2013.01); *H01L 25/0657* (2013.01); *H01L 23/481* (2013.01); *H01L 24/13* (2013.01);
(Continued)

(58) Field of Classification Search
CPC .. H01L 2924/00; H01L 23/373; B82Y 30/00; B82Y 40/00; Y10S 977/872; Y10S 977/955
USPC .......... 257/778, 783, 706, 708, 713, E23.101, 257/E23.105; 111/778, 783, 706, 708, 713, 111/E23.101, E23.105
See application file for complete search history.

(56) References Cited

U.S. PATENT DOCUMENTS

| 4,882,399 A | 11/1989 | Tesoro et al. |
| 5,506,753 A | 4/1996 | Bertin et al. |

(Continued)

FOREIGN PATENT DOCUMENTS

| JP | 2002273741 A | 9/2002 |
| JP | 2006193836 A | 7/2006 |

(Continued)

OTHER PUBLICATIONS

International Search Report and Written Opinion of the ISA dated Oct. 2, 2012—International Application No. PCT/IB2012/052398.
(Continued)

*Primary Examiner* — Ori Nadav
*Assistant Examiner* — Ernest Allen, III
(74) *Attorney, Agent, or Firm* — Stachler Intellectual Property Law LLC; Robert R. Williams

(57) ABSTRACT

The chip stack of semiconductor chips with enhanced cooling apparatus includes a first chip with circuitry on a first side and a second chip electrically and mechanically coupled to the first chip by a grid of connectors. The apparatus further includes a thermal interface material pad placed between the first chip and the second chip, wherein the thermal interface material pad includes nanofibers aligned parallel to mating surfaces of the first chip and the second chip. The method includes creating a first chip with circuitry on a first side and creating a second chip electrically and mechanically coupled to the first chip by a grid of connectors. The method further includes placing a thermal interface material pad between the first chip and the second chip, wherein the thermal interface material pad includes nanofibers aligned parallel to mating surfaces of the first chip and the second chip.

2 Claims, 5 Drawing Sheets

(51) Int. Cl.
*H01L 23/36* (2006.01)
*H01L 23/373* (2006.01)
*H01L 23/42* (2006.01)
*H01L 23/427* (2006.01)
*H01L 25/065* (2006.01)
*H01L 23/00* (2006.01)

(52) U.S. Cl.
CPC .............. *H01L24/16* (2013.01); *H01L 24/17* (2013.01); *H01L 24/81* (2013.01); *H01L 2224/131* (2013.01); *H01L 2224/14131* (2013.01); *H01L 2224/16146* (2013.01); *H01L 2224/17181* (2013.01); *H01L 2224/17519* (2013.01); *H01L 2224/29099* (2013.01); *H01L 2224/32245* (2013.01); *H01L 2224/73203* (2013.01); *H01L 2224/73253* (2013.01); *H01L 2224/81815* (2013.01); *H01L 2924/01322* (2013.01)

(56) References Cited

U.S. PATENT DOCUMENTS

| | | | |
|---|---|---|---|
| 5,912,282 | A | 6/1999 | Iyer et al. |
| 6,407,922 | B1 | 6/2002 | Eckblad et al. |
| 6,537,515 | B1 | 3/2003 | Baker et al. |
| 6,721,796 | B1 | 4/2004 | Wong et al. |
| 6,730,731 | B2 | 5/2004 | Tobita et al. |
| 6,741,019 | B1 | 5/2004 | Filas et al. |
| 6,764,759 | B2 | 7/2004 | Duvall et al. |
| 6,790,425 | B1 | 9/2004 | Smalley et al. |
| 6,891,724 | B2 | 5/2005 | De Lorenzo et al. |
| 6,965,513 | B2 * | 11/2005 | Montgomery et al. .. 361/679.46 |
| 7,189,778 | B2 | 3/2007 | Tobita et al. |
| 7,238,415 | B2 | 7/2007 | Rodriguez et al. |
| 7,270,795 | B2 | 9/2007 | Kawakami et al. |
| 7,387,747 | B2 | 6/2008 | Taya et al. |
| 7,550,129 | B2 | 6/2009 | Baker et al. |
| 7,592,389 | B2 | 9/2009 | Baker et al. |
| 7,649,308 | B2 | 1/2010 | Lee et al. |
| 7,674,410 | B2 | 3/2010 | Huang et al. |
| 7,803,262 | B2 | 9/2010 | Haik et al. |
| 2002/0054849 | A1 | 5/2002 | Baker et al. |
| 2004/0150100 | A1* | 8/2004 | Dubin et al. ................ 257/720 |
| 2005/0061496 | A1 | 3/2005 | Matabayas, Jr. |
| 2005/0239948 | A1 | 10/2005 | Haik et al. |
| 2005/0269726 | A1 | 12/2005 | Matabayas, Jr. |
| 2006/0211327 | A1* | 9/2006 | Lee et al. .................. 445/50 |
| 2006/0286712 | A1 | 12/2006 | Brunschwiler et al. |
| 2008/0001283 | A1 | 1/2008 | Lee et al. |
| 2008/0042261 | A1* | 2/2008 | Wolter et al. ............... 257/706 |
| 2008/0080144 | A1 | 4/2008 | Machiroutu |
| 2009/0068387 | A1 | 3/2009 | Panzer et al. |
| 2009/0224422 | A1* | 9/2009 | Dubin ....................... 264/259 |
| 2009/0247652 | A1 | 10/2009 | Silverman et al. |
| 2009/0269604 | A1 | 10/2009 | Wang et al. |
| 2009/0317660 | A1 | 12/2009 | Heintz et al. |
| 2010/0003530 | A1 | 1/2010 | Ganguli et al. |
| 2011/0189500 | A1 | 8/2011 | Majumdar et al. |
| 2012/0292103 | A1* | 11/2012 | Dijon ....................... 174/75 R |

FOREIGN PATENT DOCUMENTS

| | | |
|---|---|---|
| JP | 2007012911 A | 1/2007 |
| JP | 2009084746 A | 4/2009 |
| JP | 2009246258 A | 10/2009 |
| JP | 2010034254 A1 | 2/2010 |
| JP | 2010050259 A2 | 3/2010 |
| KR | 1020050107094 A | 11/2005 |
| KR | 1020070023212 A | 2/2007 |
| KR | 1020110037055 A | 4/2011 |
| WO | 2004090944 A2 | 10/2004 |
| WO | 2005031864 A1 | 4/2005 |
| WO | 2006044938 | 4/2006 |
| WO | 2007089257 | 8/2007 |
| WO | 2008112013 A1 | 9/2008 |
| WO | 2009075320 A1 | 6/2009 |

OTHER PUBLICATIONS

International Search Report and Written Opinion of the ISA dated Mar. 29, 2013—International Application No. PCT/US2012/065003.

Kopec et al., "Transient thermal performance of phase change materials with embedded graphite nanofibers," in "Thermes 2007: Thermal Challenges in Next Generation Systems," Garmella, S.V. and Fleischer, A.S., eds., Millpress, Rotterdam, The Netherlands, 2007, pp. 137-144.

Kuczynski et al. U.S. Appl. No. 12/842,200.

Ruoff et al., "Mechanical and thermal properties of carbon nanotubes," Carbon, vol. 33, No. 7, pp. 925-930, 1995.

Tibbetts, Gary G., "Growing Carbon Fibers with a Linearly Increasing Temperature Sweep: Experiments and Modeling," Carbon, vol. 30, No. 3, pp. 399-406, 1992.

Weinstein et al., "The Experimental Exploration of Embedding Phase Change Materials with Graphite Nanofibers for the Thermal Management of Electronics," J. Heat Transfer, vol. 130, Issue 4. Apr. 2008. 8 pages.

Xie et al., "Dispersion and alignment of carbon nanotubes in polymer matrix: A review," Materials Science and Engineering: R: Reports, vol. 49, Issue 4, pp. 89-112, May 19, 2005.

Rodriguez, Nelly M. et al., "Catalytic Engineering of Carbon Nanostructures", American Chemical Society, Langmuir 1995, 11, pp. 3862 to 3866.

Tong, Tao et al., "Dense Vertically Aligned Multiwalled Carbon Nanotube Arrays as Thermal Interface Materials", IEEE Transactions on Components and Packaging Technologies, vol. 30, No. 1, Mar. 2007, pp. 92-100.

Baker, R.T.K., "Synthesis, properties and applications of graphite nanofibers," Published: Jan. 1998; WTEC Hyper-Librarian, www.wtec.org/loyola/nano/us_r_n_d/09_03.htm. Downloaded May 4, 2011.

Fleischer et al., "Transient thermal management using phase change materials with embedded graphite nanofibers for systems with high power requirements," 11th Intersociety Conference on Thermal and Thermomechanical Phenomena in Electronic Systems, 2008. ITHERM 2008. May 28-31, 2008, pp. 561-566.

Ishioka et al., "Formation and Characteristics Vapor Grown Carbon Fibers Prepared in Linz-Donawitz Converter Gas," Carbon, vol. 30, No. 7, pp. 975-979. 1992.

Ishioka et al. "Formation of Vapor-Grown Carbon Fibers in CO—CO2—H2 Mixtures, I. Influence of Carrier Gas Composition," Carbon, vol. 30, No. 6, pp. 859-863, 1992.

\* cited by examiner

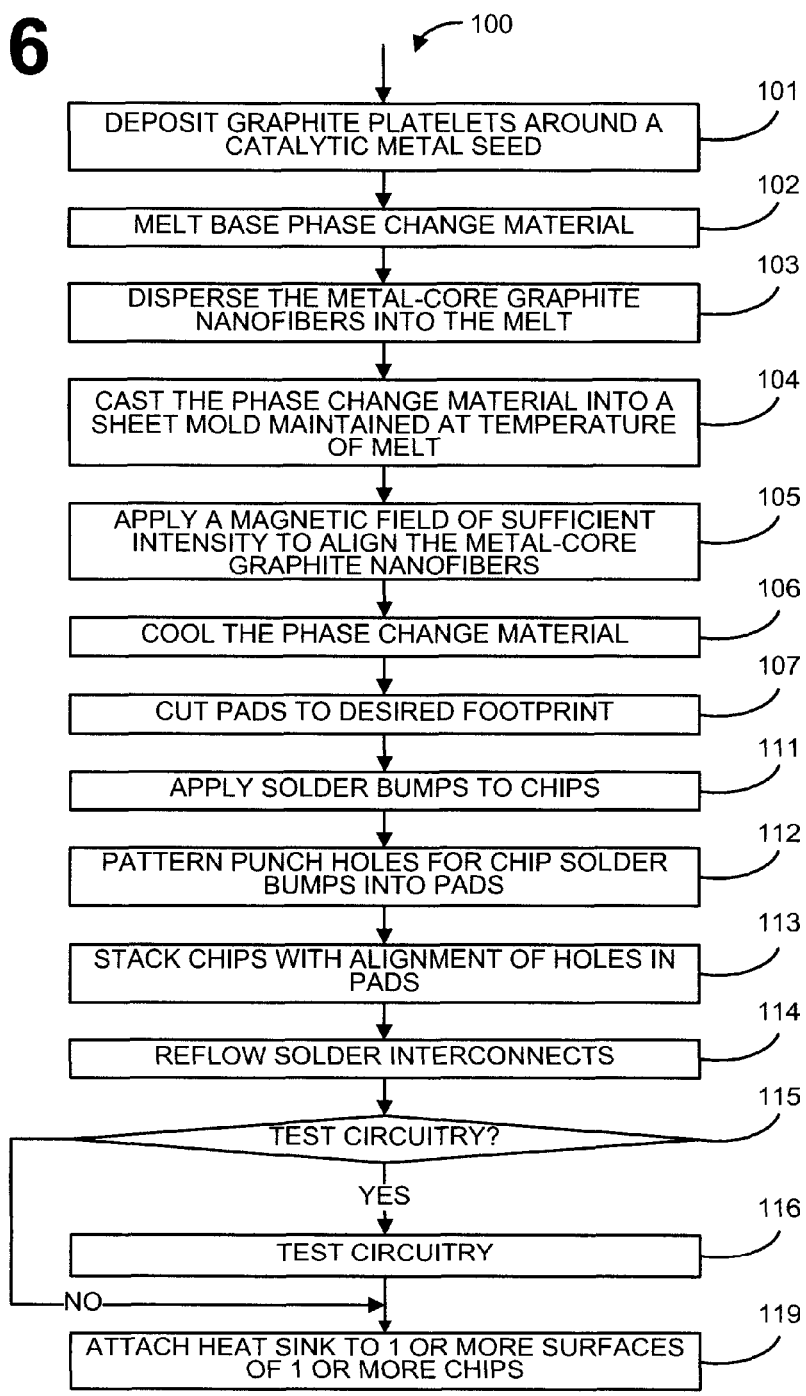

SYSTEM AND METHOD TO PROCESS HORIZONTALLY ALIGNED GRAPHITE NANOFIBERS IN A THERMAL INTERFACE MATERIAL USED IN 3D CHIP STACKS

FIELD OF THE INVENTION

The present invention generally relates to thermal interface materials, and more particularly, to a method and system for aligning graphite nanofibers in a thermal interface material used in three dimensional chip stacks.

BACKGROUND

Thermal interfaces in microelectronics packages are commonly credited with a majority of the resistance for heat to escape from the chip to an attached cooling device (e.g. heat sinks, spreaders and the like). Thus, in order to minimize the thermal resistance between the heat source and cooling device, a thermally conductive paste, thermal grease or adhesive is commonly used. Thermal interfaces are typically formed by pressing the heat sink or chip cap onto the backside of the processor chip with a particle filled viscous medium between, which is forced to flow into cavities or non-uniformities between the surfaces.

Thermal interface materials are typically composed of an organic matrix highly loaded with a thermally conductive filler. Thermal conductivity is driven primarily by the nature of the filler, which is randomly and homogeneously distributed throughout the organic matrix. Commonly used fillers exhibit isotropic thermal conductivity and thermal interface materials utilizing these fillers must be highly loaded to achieve the desired thermal conductivity. Unfortunately, these loading levels degrade the properties of the base matrix material (such as flow, cohesion, interfacial adhesion, etc.).

It has been determined that stacking layers of electronic circuitry (i.e. 3 dimensional chip stack) and vertically interconnecting the layers provides a significant increase in circuit density per unit area. However, one significant problem of the three dimensional chip stack is the thermal density of the stack. For a four layer 3 dimensional chip stack, the surface area presented to the heat sink by the chip stack has only ¼ of the surface area presented by the two-dimensional approach. For a 4-layer chip stack, there are three layer-layer thermal interfaces in addition to the final layer to grease/heat sink interface. The heat from the bottom layers must be conducted up thru the higher layers to get to the grease/heat sink interface.

On the chip side (i.e. the heat source), there usually exists hotspots, areas of higher power density, where most of the processing takes place, which results in a temperature gradient across the chip. These areas of higher heat and power density need to be kept within a set temperature range in order for the chip to perform properly and to pass quality and specification tests at the end of manufacturing.

Accordingly, it would be desirable to provide for reduced thermal resistance between heat sources and a cooling device that is both efficacious and yet not require changes to the microprocessor fabrication process.

BRIEF SUMMARY

The exemplary embodiments of the present invention provide a method for enhancing internal layer-layer thermal interface performance and a device made from the method. In particular, to a method and system for aligning graphite nanofibers in a thermal interface material used in three dimensional chip stacks.

An exemplary embodiment includes a method for enhancing the cooling of a chip stack of semiconductor chips. The method includes creating a first chip with circuitry on a first side and creating a second chip electrically and mechanically coupled to the first chip by a grid of connectors. The method further includes placing a thermal interface material pad between the first chip and the second chip, wherein the thermal interface material pad includes nanofibers aligned parallel to mating surfaces of the first chip and the second chip.

Another exemplary embodiment includes a chip stack of semiconductor chips with enhanced cooling apparatus. Briefly described in terms of architecture, one embodiment of the apparatus, among others, is implemented as follows. The chip stack of semiconductor chips with enhanced cooling apparatus includes a first chip with circuitry on a first side and a second chip electrically and mechanically coupled to the first chip by a grid of connectors. The apparatus further includes a thermal interface material pad placed between the first chip and the second chip, wherein the thermal interface material pad includes nanofibers aligned parallel to mating surfaces of the first chip and the second chip.

Another exemplary embodiment includes a system for enhancing the cooling of a chip stack of semiconductor chips. Briefly described in terms of architecture, one embodiment of the system, among others, is implemented as follows. The system includes a means for creating a first chip with circuitry on a first side and a means for creating a second chip electrically and mechanically coupled to the first chip by a grid of connectors. The system further includes a means for placing a thermal interface material pad between the first chip and the second chip, wherein the thermal interface material pad includes nanofibers aligned parallel to mating surfaces of the first chip and the second chip.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawing and detailed description of the invention are exemplary and explanatory of preferred embodiments of the invention, and are not restrictive of the invention, as claimed.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 6 is a flow chart illustrating an example of a method of forming a silicone device utilizing the thermal interface material with graphite nanofibers aligned by a magnetic field to orient the conductive axis in the desired direction of the present invention.

Figure 1:
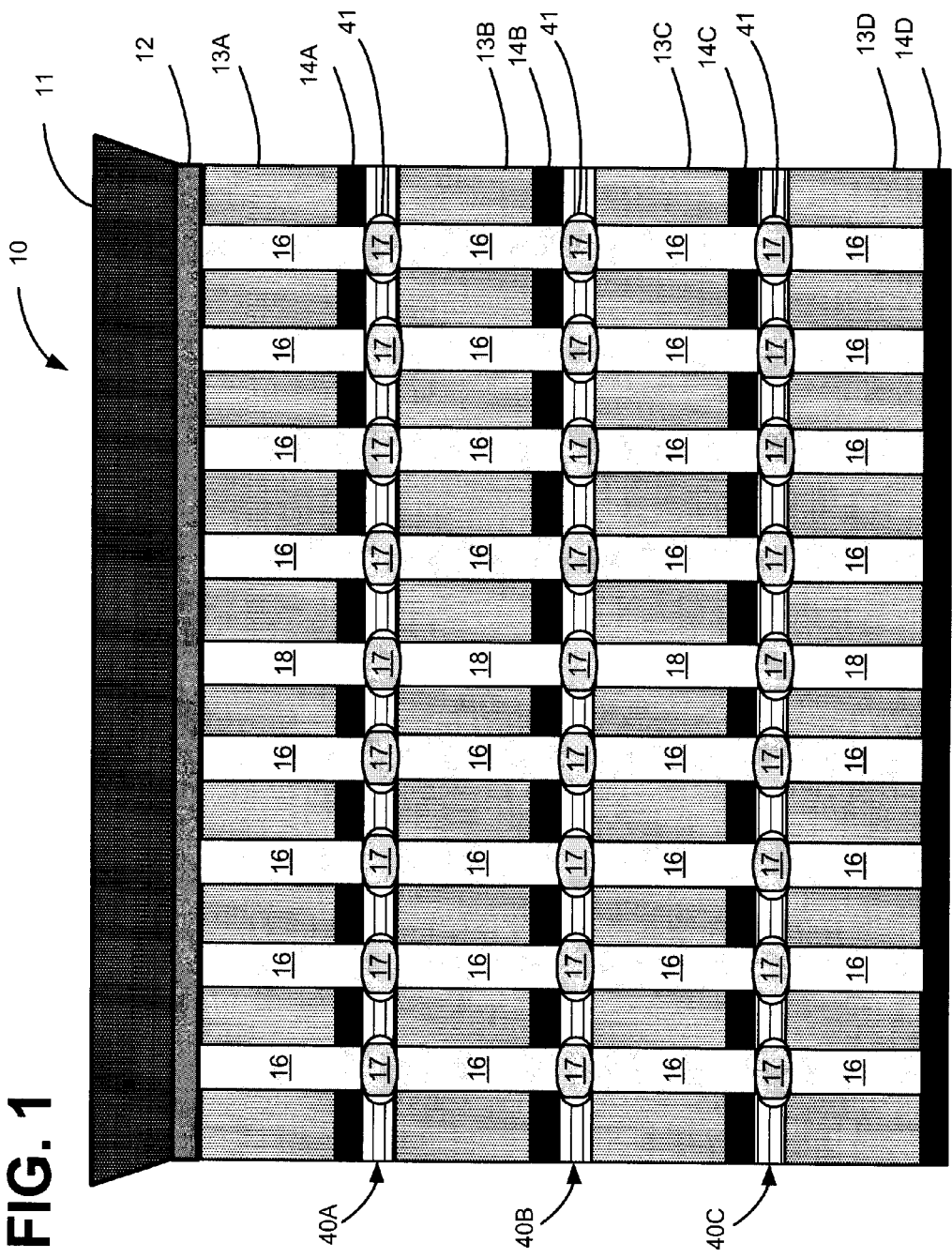
FIG. 1 is a cross section block diagram illustrating an example of the C4 or flip chip connection channels in a silicon device stack utilizing the thermal interface material with graphite nanofibers aligned by a magnetic field to orient the conductive axis in the desired direction of the present invention.

The detailed description explains the preferred embodiments of the invention, together with advantages and features, by way of example with reference to the drawings.

DETAILED DESCRIPTION

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention.

One or more exemplary embodiments of the invention are described below in detail. The disclosed embodiments are intended to be illustrative only since numerous modifications and variations therein will be apparent to those of ordinary skill in the art.

One or more exemplary embodiments of the invention are directed to providing a material that is placed between chips in a chip stack. The materials having carbon nanofibers/nanotubes aligned to efficiently transfer heat to at least two sides (e.g., east and west, or north and south) of a chip stack. The materials having carbon nanofibers/nanotubes aligned transfers heat more efficiently along the axis of the carbon nanofibers/nanotubes. The carbon nanofibers are formed around magnetic "seeds". The material is heated and the carbon nanofibers/nanotubes are mixed into a liquified material. A magnetic field is applied in a direction parallel to sides of a pad that would be in contact with semiconductor chips or other like electronic devices. The field is strong enough to align the carbon nanofibers/nanotubes. The material is then cooled, sliced into pads and placed between layers of chips in the chip stack. In one embodiment, all carbon nanofibers/nanotubes are aligned "east/west" and draw the heat to heat sinks on the east and west sides of the chip stack. In another embodiment, the pads are alternated among chips so that alternating layers draw heat to heat sinks on the east/west sides of the chip stack and to the north/south side of the chip stack. In still another embodiment, pieces of the pads are arranged such that two opposite sides of the arrangement conduct heat east/west and another two opposite sides conduct heat north/south. In this embodiment, the carbon nanofibers/nanotubes are arranged so that both ends are perpendicular to the closest edge of the pad.

It is well established that the incorporation of certain types of materials with sufficient flow characteristics to "flow" and "fill" those gaps are not very thermally conductive. Materials with low-viscosity/high surface tension are required to fill the space between the layers of chips in a chip stack. Thermal properties of underfills and other adhesives are improved by mixing (or "filling") ceramic, metal, and/or other particulate or strands into the primary polymer or epoxy.

A thermal interface material is used to fill the gaps between thermal transfer surfaces, such as between microprocessors and heatsinks, in order to increase thermal transfer efficiency. These gaps are normally filled with air which is a very poor conductor. A thermal interface material may take on many forms. The most common is the white-colored paste or thermal grease, typically silicone oil filled with aluminum oxide, zinc oxide, or boron nitride. Some brands of thermal interface materials use micronized or pulverized silver. Another type of thermal interface materials are the phase-change materials. The phase change materials are solid at room temperature, but liquefy and behave like grease at operating temperatures.

A phase change material is a substance with a high heat of fusion which, melting and solidifying at a certain temperature, is capable of storing and releasing large amounts of energy. Heat is absorbed or released when the material changes from solid to liquid and vice versa; thus, phase change materials are classified as latent heat storage units.

Phase change materials latent heat storage can be achieved through solid-solid, solid-liquid, solid-gas and liquid-gas phase change. However, the only phase change used for phase change materials is the solid-liquid change. Liquid-gas phase changes are not practical for use as thermal storage due to the large volumes or high pressures required to store the materials when in their gas phase. Liquid-gas transitions do have a higher heat of transformation than solid-liquid transitions. Solid-solid phase changes are typically very slow and have a rather low heat of transformation.

Initially, the solid-liquid phase change materials behave like sensible heat storage materials; their temperature rises as they absorb heat. Unlike conventional sensible heat storage, however, when phase change materials reach the temperature at which they change phase (i.e. melting temperature) they absorb large amounts of heat at an almost constant temperature. The phase change material continues to absorb heat without a significant rise in temperature until all the material is transformed to the liquid phase. When the ambient temperature around a liquid material falls, the phase change material solidifies, releasing its stored latent heat. A large number of phase change materials are available in any required temperature range from −5 up to 190° C. Within the human comfort range of 20° to 30° C., some phase change materials are very effective. They can store 5 to 14 times more heat per unit volume than conventional storage materials such as water, masonry, or rock.

It is well known that the incorporation of certain types of carbon nanofibers into thermal interface material can impart thermal conductivity to such materials. Carbon nanofibers or carbon nanotubes, can be dispersed in thermal interface material by various well-known techniques. These techniques include, but are not limited to, melting, kneading and dispersive mixers to form an admixture that can be subsequently shaped to form a thermally conductive article.

Nanofibers are defined as fibers with diameters on the order of 100 nanometers. They can be produced by interfacial polymerization and electrospinning. Carbon nanofibers are graphitized fibers produced by catalytic synthesis around a catalytic core. The catalytic core around which graphite platelets are formed is, for exemplary purposes, called a metal seed or a catalytic metal seed, wherein the catalytic metal seed is a material having magnetic properties such as iron, cobalt, or nickel. Other non-metal materials suitable for forming magnetically alignable graphite nanofibers are within the scope of the invention.

Graphite nanofibers can be grown in numerous shapes around a catalytic metal seed. From the physical point of view, graphite nanofibers vary from 5 to 100 microns in length and are between 5 to 100 nm in diameter. The graphite nanofibers comprised of graphite platelets are arranged in various orientations with respect to the long axis of the fiber, giving rise to assorted conformations. In one embodiment, a magnetic field is applied to the metal catalyst prior to deposition of the graphite nanofibers on the metal-core. With the application of a magnetic field, the magnetic poles of the seed are aligned with the magnetic field and will subsequently carry the attached graphite nanofibers along with them as they rotate in the applied field following deposition.

With a diamond shaped catalytic metal seed, the majority of the graphite platelets will align along the fiber axis as dictated by an external magnetic field, so that the catalytic metal seed may have its poles aligned perpendicular to or parallel to the external magnetic field. The seed particles are not limited to elongated diamonds, so that the deposited metal-core graphite nanofiber forms the chevrons. The graphite platelets can assume any of a myriad of shapes. If the catalytic metal seeds are rectangular plates, then the graphite platelets are deposited as plates. If the catalytic metal seeds are cylindrical, then the graphite platelets are deposited as cylindrical plates. If the catalytic metal seeds are little bars, then the graphite platelets are deposited as rectangular solids along the long axis of the rectangular bar. The graphite platelets assume the geometry of the catalytic metal seed surface.

Carbon nanotubes (CNTs) are allotropes of carbon with a cylindrical nanostructure. Nanotubes have been constructed with a length-to-diameter ratio of up to 132,000,000:1, significantly larger than any other material. They exhibit extraordinary strength and unique electrical properties, and are efficient thermal conductors.

Nanotubes are members of the fullerene structural family, which also includes the spherical buckyballs. The ends of a nanotube may be capped with a hemisphere of the buckyball structure. Their name is derived from their size, since the diameter of a nanotube is on the order of a few nanometers (approximately 1/50,000th of the width of a human hair), while they can be up to 18 centimeters in length.

Graphite nanofibers and nanotubes have received considerable attention in the electronics field due to their remarkable thermal conductivity. Moreover, the thermal conductivity of graphite nanofibers and nanotubes ares anisotropic. Anisotropy is the property of being directionally dependent, as opposed to isotropy, which implies homogeneity in all directions. Therefore, the present invention takes advantage of the anisotropic nature of the graphite nanofibers and nanotubes by effectively aligning them along the conductive axis, thereby generating a thermal interface material with exceptional thermal conductivity at comparatively low loading levels. Diamond, graphite, and graphite fibers have been known as excellent heat conductors with a high thermal conductivity up to 3000 W/m–K.

All nanotubes are expected to be very good thermal conductors along the tube, exhibiting a property known as "ballistic conduction", but good insulators laterally to the tube axis. Measurements show that a single wall nanotube has a room-temperature thermal conductivity along its axis of about 3500 W/m·K compare this to copper, a metal well-known for its good thermal conductivity, which transmits 385 W/m·K. A single wall nanotube has a room-temperature thermal conductivity across its axis (in the radial direction) of about 1.52 W/m·K, which is about as thermally conductive as soil. Diamond, graphite, and graphite fibers have been known as excellent heat conductors with a high thermal conductivity up to 3000 W/m–K. Below is table 1 that lists the maximum power per chip which can be cooled effectively, assuming 100% coverage, with the incorporation of certain types of materials into thermal interface material and the thermal conductivity of such materials.

TABLE 1

| TIM Materials | Conductivity (W/mK) | Power (W) per chip |
|---|---|---|
| Grease | 2.8 | 35 |
| Gel | 5.7 | 80 |
| CNF | 6000 | >300 |
| CNT | 3500 | ~150 |

Referring now to the drawings, in which like numerals illustrate like elements throughout the several views. FIG. 1 is a cross section block diagram illustrating an example of a controlled collapse chip connection 17 (i.e. C4) or flip chip electrically conductive channels 16 and thermal conductive channels 18 utilized in a chip stack 10.

The chip stack 10 comprises a multitude of chips 13 (A-D) that further include one or more electrically conductive channels 16 and/or thermal conductive channels 18, which extend through a chip 13 from the top surface to the bottom surface. In one embodiment, the "conductive channel" is really a combination of two or more thru-silicon-vias (TSVs) connected sequentially by one or more controlled collapse chip connection 17 (C4s).

Preferably, the electrically conductive channels 16 are formed of tungsten or copper; however, other conductive materials may be used and are contemplated. The electrically conductive channels 16 selectively conduct electrical signals to and from portions of the circuitry 14 thereon or simply couple to solder bumps 17 to interconnect differing chips 13 in the chip strack 10 (e.g., chips 13A and 13B), or both. The solder bumps 17 are located within an area 41 of a thermal interface material (TIM) pad 40. In one embodiment, the area 41 is punched out of the TIM pad 40. In another embodiment, the area 41 is formed during the creation of the TIM pad 40.

The TIM pad 40 comprises carbon nanotubes (CNTs) or graphic nanofibers (GNFs) that are dispersed in a phase change material (PCM) or a silicone grease. The CNTs or GNFs are then aligned in the xy plane (i.e. positioned parallel to the surface of the chip 13). This is so that heat may be brought to the edges of the chip stack 10. Once the heat is brought to the edges of the chip stack 10, multiple heat sinks or other type devices may be utilized to more efficiently dissipate that heat of the chip stack 10.

The CNTs or GNFs are aligned in the thermal interface material 30 in one direction by an applied magnetic field. By aligning the CNTs or GNFs along the conductive axis in the xy plane of the 3D chip strack 10 creates a TIM pad 40 with exceptional thermal conductivity at comparatively low loading levels. The system and method for aligning graphic nanofibers to enhance thermal interface material performance are described in commonly assigned and co-pending U.S. Patent Application entitled "A METHOD AND SYSTEM FOR ALLIGNMENT OF GRAPHITE NANOFIBERS FOR ENHANCED THERMAL INTERFACE MATERIAL PERFORMANCE", Ser. No. 12/842,200 filed on, Jul. 23, 2010, herein incorporated by reference.

Preferably, the thermal conductive channels 18 are formed and filled with conductive materials, metal or alternatively are formed of thermal grease. The thermal grease is typically silicone oil filled with aluminum oxide, zinc oxide, or boron nitride; however, other conductive materials may be used and are contemplated. Some brands of thermal conductive channels 18 use micronized or pulverized silver. Another type of thermal conductive channels 18 are the phase-change materials. The phase change materials are solid at room temperature, but liquefy and behave like grease at operating temperatures. The thermal conductive channels 18 conduct heat to and from to portions of the circuitry 14 thereon. The thermal conductive channels 18 couple to solder bumps 17 to interconnect differing chips 13 in the chip strack 10 (e.g., chips 13A and 13B), couple to heat sink 11 through thermal grease 12 or TIM pad 40 of the present invention, that conducts the heat to the side of the chip stack 10.

The conductive channels 16 couple to solder bumps 17 on a bond pad (not shown) on the bottom surface of chip 13A-C. The solder bumps 17 are electrically isolated from the chip 13 and one another according to conventional practice. In addition, the conductive channels 16 are preferably electrically insulated from the chip 13 by insulating regions (not shown) which are disposed between the conductive channels 16 and the chip 13. The insulating regions preferably are silicon dioxide ($SiO_2$); however, other insulating materials may be employed and are contemplated as falling within the scope of the present invention. The insulating regions prevent the signals being transmitted in the electrically conductive channels 16 from disturbing the bias voltage of the chip 13 (which is typically either a ground potential or a Vdd). Of course, in some cases, one of the terminals of the circuitry 14 on the top surface may be held at a substrate potential, in which case, the appropriate electrically conductive channel 16 may be non-insulated and thus be in electrical contact with the chip 13 being held at a similar potential, as may be desired.

As shown, each chip 13 uses conductive channels 16 in a controlled, collapse chip connection (C4) structure (also often called solder bump or flip-chip bonding). The chip strack 10 includes a base chip 13A. Solder bumps 17 are then placed on a bond pad (not shown) for the conductive channel 16 of a second (or top) chip 13A, which is oriented face-down (i.e., flip-chip), aligned and brought into contact with the conductive channels 16. Electrical interconnections between the electrically conductive channels 16 are formed by heating the solder bumps 17 to a reflow temperature, at which point the solder flows. After the solder flows, subsequent cooling results in a fixed, electrically conductive joint to be formed between the electrically conductive channels 16.

The base chip 13A on one side is attached to a heat sink 11 with thermal grease 12. In an alternative embodiment, a thermal interface material incorporating vertically aligned carbon (graphite) nanofibers can be utilized in place of thermal grease 12 as a very effective thermal interface material between a top of base chip 13A and a heat sink 11. Such an arrangement is disclosed in U.S. Patent Application (entitled "A METHOD AND SYSTEM FOR ALLIGNMENT OF GRAPHITE NANOFIBERS FOR ENHANCED THERMAL INTERFACE MATERIAL PERFORMANCE", Ser. No. 12/842,200. Other chips 13B-13D can have C4 connection structures implemented on both the top surface and bottom surface thereof, as illustrated in FIG. 1. In such instances, a second chip 13B may similarly be oriented facedown with respect to the base chip 13A and coupled thereto-using solder bumps 17.

The C4 structure of FIG. 1 overcomes one disadvantage of the connection methodologies. Initially, because the ball-bonding attachment technique is avoided, significantly less stress is placed on the solder bump 17 during connection, which allows circuitry 14A-C to be formed under the solder bump 17. The circuitry 14A-C is formed according to any one of many conventional semiconductor processing techniques. However, the C4 structure of FIG. 1 has one major disadvantage of not being able to dissipate the heat generated by circuitry 14 A-D. The TIM pad 40 of the present invention, comprises carbon nanotubes (CNTs) or graphic nanofibers (GNFs) that are dispersed in a phase change material (PCM) or a silicone grease. The CNTs or GNFs are aligned in the position parallel to the surface of the chip 13. This is so that heat may be brought to the edges of the chip stack 10. Once the heat is brought to the edges of the chip stack 10, multiple heat sinks or other type devices may be utilized to more efficiently dissipate that heat of the chip stack 10. In one embodiment, all carbon nanofibers/nanotubes are aligned "east/west" and draw the heat to heat sinks on the east and west sides of the chip stack.

Figure 2A:
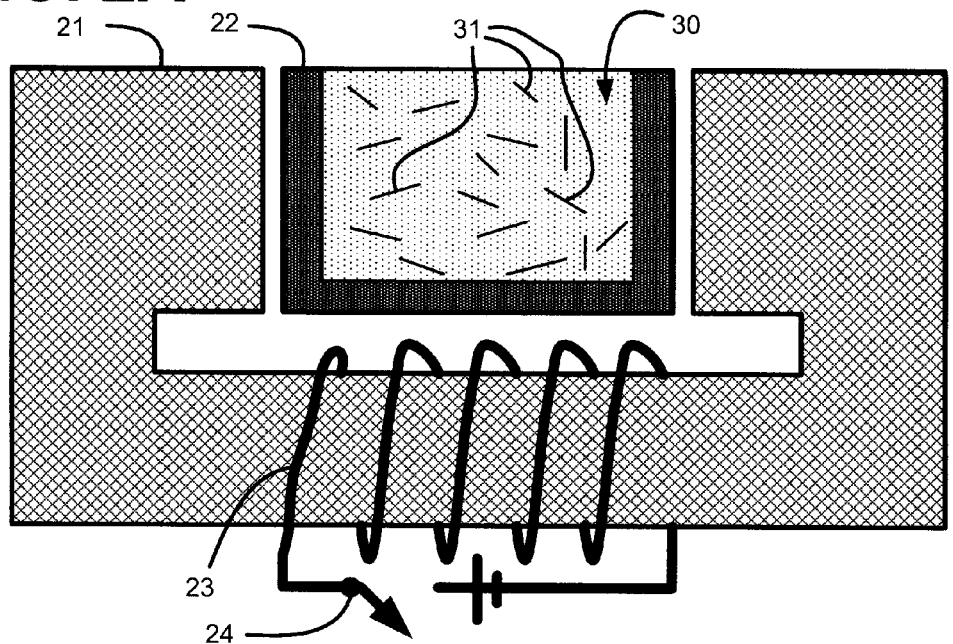
FIG. 2A is a block diagram illustrating an example of the graphite nanofibers randomly dispersed in the thermal interface material.

FIG. 2A is a block diagram illustrating an example of the graphite nanofibers 31 randomly dispersed in the thermal interface material 30. As shown there is thermal interface material 30 in a crucible 22. The crucible 22 is heated to a temperature so that the thermal interface material 30 melts. In one embodiment, the thermal interface material 30 is melted at a temperature 10-20 C above the thermal interface material 30 melting temperature. In one embodiment, the thermal interface material 30 is a paraffin based material. In other embodiments, is surrounded on two sides by electromagnet 21. The magnetic fields are generated in the electromagnet 21 by coils 23 around the electromagnet 21. The coils are connected to switch 24 which allows power to be applied.

Figure 2B:
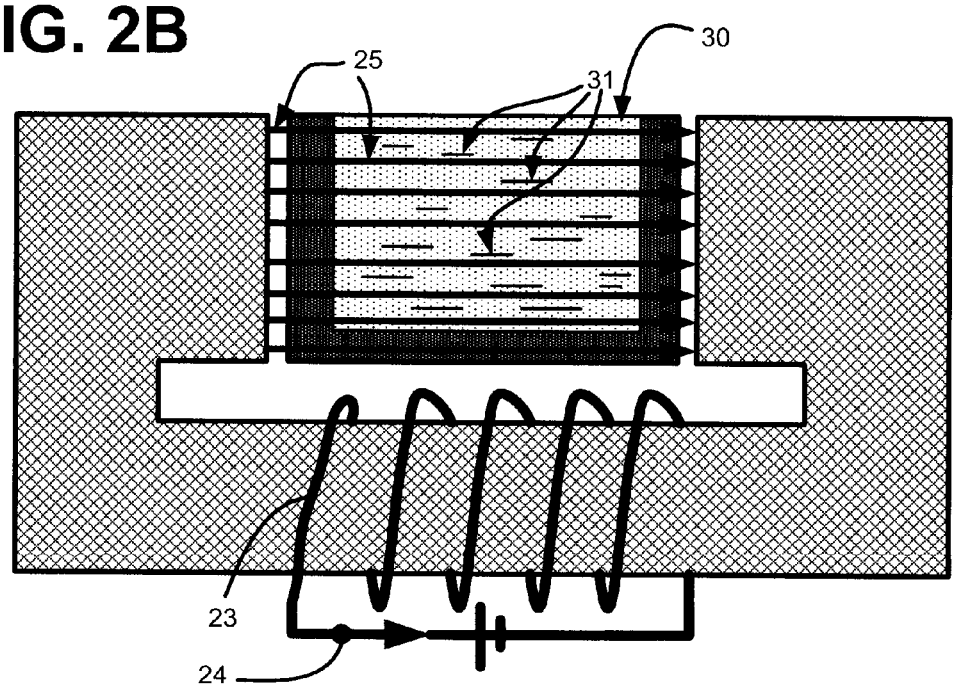
FIG. 2B is a block diagram illustrating an example of the thermal interface material with graphite nanofibers aligned by a magnetic field to orient the conductive axis in the desired direction in the thermal interface material.

FIG. 2B is a block diagram illustrating an example of the thermal interface material 30 with graphite nanofibers 31 aligned by a magnetic field 25 to orient the conductive axis in the desired direction in the thermal interface material 30. A magnetic field 25 of sufficient intensity is applied to the thermal interface material 30 containing the graphite nanofibers 31, in order to align the graphite nanofibers 31. In one embodiment, the long axis of the graphite nanofibers 31 are aligned in an orientation parallel to the mating surfaces. In another embodiment, the graphite nanofibers 31 are aligned along the conductive axis of the graphite fibers. The crucible 22 is cooled to approximately room temperature. Once the crucible 22 with the aligned graphite nanofibers 31 in the phase change material has cooled to approximately room temperature, the thermal interface material 30 is removed from the crucible 22. In one embodiment, room temperature is normally within the range of 60 to 80° F., or 11.5 the thermal interface material 30 can be, but is not limited to, paraffins ($C_nH_{2n+2}$); fatty acids ($CH_3(CH_2)_{2n}COOH$); metal salt hydrates ($M_nH_2O$); and eutectics (which tend to be solutions of salts in water). In still another embodiment the thermal interface material 30 can be silicone-based gels or pastes that are eventually cured into pads.

The graphite nanofibers 31 are disbursed into the melted thermal interface material 30 using well-established methods. In one embodiment, a high-speed dispersive mixer can be utilized. The amount of graphite nanofibers 31 in the thermal interface material 30 of the present invention will typically be in the range of 4 to 10 weight percent based on the amount of base phase change material, preferably ~5 weight percent. The graphite nanofibers 31 typically are dispersed essentially homogeneously throughout the bulk of the thermal interface material 30. The crucible is cooled to 26.5° C. The TIM pads 40 are then cut to the desired footprint from the thermal interface material 30. Pads of appropriately sized geometry (length X and width Y) are cut from the slab of thermal interface material 30 using conventional techniques known to those skilled in the art. The geometry is dictated by the footprint of the integrated circuit to which the thermal interface material pad 40 will be mated.

According to the present disclosure, the thermal conductivity at desired locations is increased by TIM pad 40 with aligned graphite nanofibers 31 between the multiple chips 13A-D. By utilizing the TIM pad 40 with aligned graphite nanofibers 31 between multiple chips 13A-D, more heat transfer to the edge of the chip strack 10 can be achieved. The advantage of this solution is that it further reduces chip temperatures through no modification to the chip surface and does not require changes to the manufacturing line or the addition of more components to the system such as liquid coolants and microchannel heat exchangers.

Figure 3A:
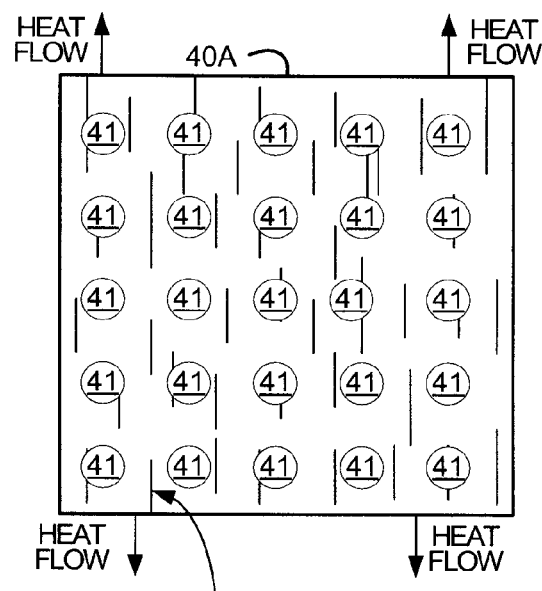
FIGS. 3A and 3B are block diagrams illustrating an example of the thermal interface material with graphite nanofibers aligned by a magnetic field to orient the conductive axis in perpendicular directions to the thermal interface material, and having a plurality of punch holes formed at various locations thereon.
Figure 3B:
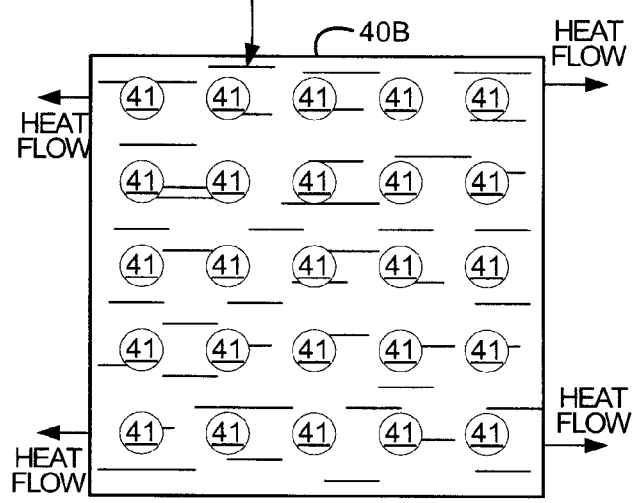

FIGS. 3A and 3B are block diagrams illustrating an example of the TIM pad 40 with graphite nanofibers 31 aligned by a magnetic field 25 to orient the conductive axis in perpendicular directions to the TIM pad 40, and having a plurality of areas 41 formed at various locations thereon. Areas 41 provide space for the solder bumps 17 that are formed on conductive channels 16, on the chip 13. The solder bumps 17 rest on conductive channels 16 to connect one chip to another through TIM pad 40 to electrically conductive signals from one chip 13 to another chip 13. In one embodiment, the solder bumps 17 can conduct heat from one chip 13 to another chip 13 and eventually heat sink 11 or conduct heat laterally from the solder bumps 17 through TIM pad 40 between two chips 13 to the edges of the chip stack 10. In another embodiment, the direction of the graphite nanofibers 31 in TIM pads 40 are alternated among chips so that alternating layers draw heat to heat sinks on the east/west sides of the chip stack and to the north/south side of the chip stack.

As shown, the plurality of solder bumps 17 and areas 41 are circular, however, this is for illustration only and the solder bumps 17 and areas 41 may be of any shape including, but not limited to, triangular, rectangular, square, circular, elliptical, irregular or any four or more sided shape. The size and shape of areas 41 are generally determined by the size and shape of solder bump 17. This is in order to provide a space in the TIM pad 40 for the solder bumps 17.

Also as shown, the solder bumps 17 and areas 41 in one embodiment are laid out in regular patterns, however, this is for illustration only and the solder bumps 17 and areas 41 have the flexibility to be laid out in any desired pattern. This additional level of flexibility allows the circuitry 14A-C to be laid out without regard to the solder bumps 17 and areas 41 locations. This further allows the solder bump 17 locations above the circuitry 14A-C to be located in an optimized fashion, to directly couple with circuitry on another chip 13. In another embodiment, the solder bumps 17 and areas 41 may be formed in a pattern where the conductive channels 16 provide power at the periphery of the chip 13 to aid in cooling the chip 13. Therefore, the solder bumps 17 and areas 41 may be located anywhere on the chip 13A-D as illustrated in FIG. 1, without the need to form such interconnections on peripheral edges of the die.

A TIM pad 40 is used to remove any gaps between thermal transfer surfaces, such as between chips 13 (A-D), microprocessors and heat sinks, in order to increase thermal transfer efficiency. Any gaps are normally filled with air, which is a very poor conductor.

FIGS. 3A and 3B are block diagrams illustrating an example of the thermal interface material pads (TIM) 40A and 40B with graphite nanofibers 31 aligned by a magnetic field 25 (FIG. 2B) to orient the conductive axis in perpendicular directions to the TIM pad 40A and 40B. In addition, there are a plurality of areas 41 formed at various locations thereon. These areas 41 are for the solder bumps 17 to connect to chips 13 together. In an alternative embodiment, additional TIM pads 40 are in thermal contact with edges of TIM pads 40 hanging out between chips 13, to effectively draw heat to a heatsink 11 on a top of the chip stack 10. In another alternative embodiment, the additional TIM pads 40 are in thermal contact with edges of TIM pads 40 hanging out between chips 13, to effectively draw heat to a heatsink 11 on the sides of the chip stack 10.

Figure 4:
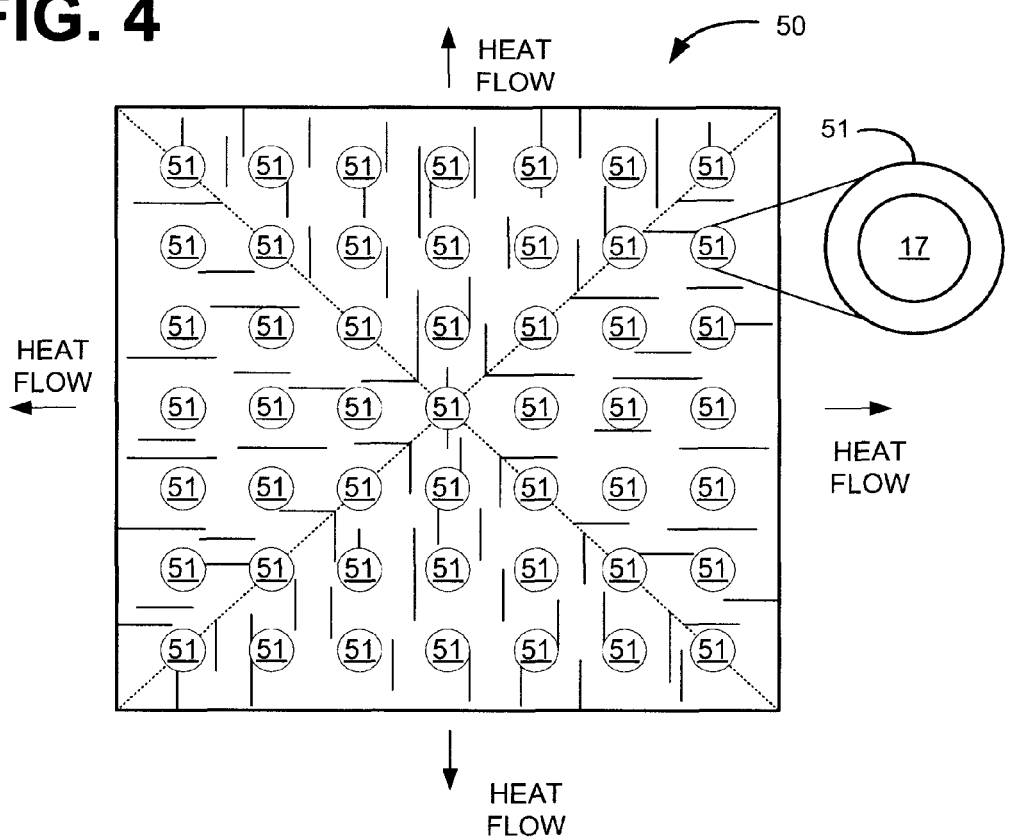
FIG. 4 is a block diagram illustrating an example of the thermal interface material with graphite nanofibers arranged such that two opposite sides of the thermal interface material with graphite nanofibers conduct heat in the east/west direction and another two opposite sides conduct heat in the north/south direction.

FIG. 4 is a block diagram illustrating an example of the thermal interface material pad 50 with graphite nanofibers 31 arranged such that two opposite sides of the thermal interface material 30 with graphite nanofibers 31 conduct heat in one direction parallel with the sides of the TIM pad 50 in contact with chip 13 and another two on opposite sides conduct heat in a second direction perpendicular to the first direction and still parallel with the sides of the TIM pad 50 in contact with chip 13. In this alternative embodiment, the uni-directional TIM pad 50 displayed in a top down view illustrated in FIGS. 3A and 3B can be easily sectioned and connected together to conduct heat to all 4 sides of the chip stack as shown. In this alternative embodiment, the pattern areas 51 for the chip solder bumps 17 on TIM pad 50 are generally applied after assembling the TIM pad 50. This is to ensure that the area 51 for the chip solder bumps 17 on chips 13 are properly aligned.

Figure 5:
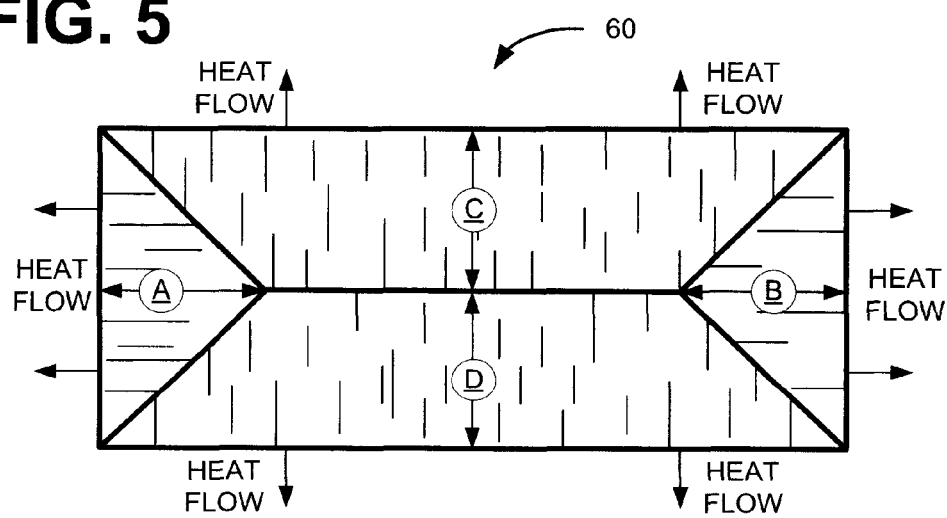
FIG. 5 is a block diagram illustrating another example of the thermal interface material with graphite nanofibers arranged such that two opposite sides of the thermal interface material with graphite nanofibers conduct heat in the east/west direction and another two opposite sides conduct heat in the north/south direction.

FIG. 5 is a block diagram illustrating another example of the thermal interface material pad 60 with graphite nanofibers 31 arranged such that two opposite sides of the thermal interface material 30 with graphite nanofibers 31 conduct heat one direction parallel with the sides of the TIM pad 60 in contact with chip 13 and another two on opposite sides conduct heat in a second direction perpendicular to the first direction and still parallel with the sides of the TIM pad 40 in contact with chip 13. In this alternative embodiment, the uni-directional TIM pad 40 displayed in a top down view illustrated in FIGS. 3A and 3B can be easily sectioned and connected together to conduct heat to all 4 sides of the chip stack as shown, so that the graphite nanofibers 31 conduct heat to the closest edge of the TIM pad 60. In this alternative embodiment, the TIM pad 60 is in a rectangular shape where A=B=C=D no matter what the W/L ratio of the rectangle. In this alternative embodiment, a chip strack 10 of memory chips is covered. The pattern areas 61 for the chip solder bumps 17 on TIM pad 60 are generally applied after assembling the TIM pad 60. This is to ensure that the area 61 for the chip solder bumps 17 on chips 13 are properly aligned.

FIG. 6 is a flow chart illustrating an example of a method of forming a chip strack 10 utilizing the TIM pad 40 with graphite nanofibers 31 aligned by a magnetic field 25 to orient the conductive axis in the desired direction of the present invention. There are a couple approaches to forming the individual chips 13, and subsequent assembly, so the following is just one method of constructing silicon devices in a multilayer strack 10 utilizing the thermal interface material pad 40 with aligned graphite nanofibers 31.

At step 101, the catalytic metal seeds are deposited in the disposition chamber. The seed particles are not limited to any particular shape and can be created as per known literature methods. The seed particles can assume any of a myriad of shapes and they can be formed as little bars. If the seed particles are rectangular plates, then the graphite platelets deposit as plates; if the seed particles are cylindrical, then the graphite platelets deposit as cylindrical plates. The graphite platelets assume the geometry of the surface of the catalytic metal seed. The chamber is charged with the reactive gas mixture. By judicious choice of the catalytic metal seed catalyst, the ratio of the hydrocarbon/hydrogen reactant mixture, and reaction conditions, it is possible to tailor the morphological characteristics, the degree of crystallinity, and the orientation of the precipitated graphite crystallites with regard to the fiber axis. In one embodiment, the catalytic synthesis uses carbon-containing gases that include, but are not limited to, ethylene-hydrogen mixtures, methane-hydrogen mixtures, $CO-CO_2-H_2$ mixtures, $CO$, $CH_4$, acetylene and benzene have been used as the carbon-containing gases. In another embodiment, a Linz-Donawitz converter gas (LDG), of which the composition is approximately 67% $CO$, 16% $CO_2$, 11% $N_2$, 1.2% $H_2$, 0.2% $0_2$, and 0.6% $H_2O$ can be utilized. Other gas combinations known in the art can also be utilized. The gas mixture thermally decomposes onto the catalytic metal seed to generate the graphite nanofibers 31.

At step 102, the thermal interface material 30 is melted in crucible 22. In one embodiment, the base thermal interface material 30 is melted at a temperature 10-20 C above the thermal interface material 30 melting temperature. In one embodiment, the thermal interface material 30 is a paraffin based material. In other embodiments, the thermal interface material 30 can be, but is not limited to, paraffins ($C_nH_{2n+2}$); fatty acids ($CH_3(CH_2)_{2n}COOH$); metal salt hydrates ($M_nH_2O$); and eutectics (which tend to be solutions of salts in water). In still another embodiment, the graphite nanofibers 31 can be dispersed in silicone-based gels or pastes that are used as thermal interface material 30 that are eventually cured into pads.

At step 103, the graphite nanofibers 31 are disbursed into the melt using well-established methods. In one embodiment, a high-speed dispersive mixer can be utilized. The amount of graphite nanofibers 31 in the thermal interface material 30 of the present invention will typically be in the range of 4 to 10 weight percent based on the amount of thermal interface material 30, preferably ~5 weight percent. The graphite nanofibers 31 typically are dispersed essentially homogeneously throughout the bulk of the thermal interface material 30. In an alternative embodiment, carbon nanotubes may be substituted for the graphic nanofibers 31.

At step 104, the thermal interface material 30 is cast into a crucible 22. The temperature of the phase change material and cast is maintained at approximately the melting temperature acquired at step 102. At step 105, a magnetic field 25 (FIG. 2B) of sufficient intensity is applied to the thermal interface material 30 containing the graphite nanofibers 31, in order to align the graphite nanofibers 31. In one embodiment, the long axis of the graphite nanofibers 31 are aligned along the conductive axis of the graphite fibers. In another embodiment, the graphite nanofibers 31 are aligned in an orientation perpendicular to the mating surfaces. In still another embodiment, the magnetic field is normally within the range of 500-100,000 Gauss or 0.05-10 Tesla.

At step 106, the crucible 22 is cooled to approximately room temperature. Once the crucible 22 with the aligned graphite nanofibers 31 in the phase change material has cooled to approximately room temperature, the thermal interface material 30 is removed from the crucible 22. In one embodiment, the room temperature is normally within the range of 60 to 80° F., or 11.5 to 26.5° C. At step 107, the TIM pads 40 are cut to the desired footprint. TIM pads 40 of appropriately sized geometry (length X, width Y and thickness Z) are cut from the slab of thermal interface material 30 using conventional techniques known to those skilled in the art. The geometry of TIM pad 40 is dictated by the footprint of the integrated circuit to which the TIM pads 40 will be mated.

At step 111, solder bumps 17 are then formed on the on the bottom surface of the chip 13. These solder bumps 17 are generally in alignment with the conductive channels 16 on chip 13 in order to conduct electrical signals. In an alternative embodiment, thermal conductive channels 18 may conduct heat instead of electronic signals and use a solder bump 17 with thermal conductive ability. In one embodiment, a homogenous process could be used to create solders bump 17 for both electrically conductive channels 16 and any thermal conductive channels 18.

At step 112, areas 41 are placed within the pads 42 corresponding with solder bumps 17 on chips 13. This will allow these solder bumps on chip 13 to extend through TIM pads 40 in order to mechanically and electrically connect another chip 13. At step 113, the chips 13 in the chip strack 10 are assembled with the TIM pads 40 in between two adjacent chips 13.

At step 114, the chip strack 10 is heated to a reflow temperature, at which point the solder in the solder bumps 17 flows. Subsequent cooling results in a fixed, electrically conductive joint to be formed between the electrically conductive channels 16. An example of this is to have the bottom surface of a first chip 13A coupled to a top surface of a second chip 13B with an TIM pad 40A (FIG. 1) in between.

At step 115, it is determined if the circuitry on chips 13 in chip strack 10 are to be tested. If it is determined in step 115 that testing the circuitry in the chip strack 10 is not to be performed, then the method 100 skips to step 119. However, if it is determined at step 114 that the circuitry on chips 13 in chip strack 10 are to be tested, then the circuitry is tested for electrical performance, at step 116.

At step 119, the method 100 attaches a heat sink 11 to one or more surfaces of one or more chips 13.

The terminology used herein is for describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The flowchart and block diagrams in the Figures illustrate the functionality, and operation of possible implementations of systems and methods according to various embodiments of the present invention. In this regard, each block in the flowchart or block diagrams may represent a module, segment, or task to be performed, which comprises one or more executable steps for implementing the specified function(s). It should also be noted that, in some alternative implementations, the functions noted in the block may occur out of the order noted in the Figures. For example, two blocks shown in succession may in fact be performed substantially concurrently or the blocks may sometimes be executed in the reverse order, depending upon the functionality involved.

It should be emphasized that the above-described embodiments of the present invention, particularly any "preferred" embodiments, are merely possible examples of implementations set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The invention claimed is:

1. A chip stack comprising:
 a first semiconductor chip and a second semiconductor chip, the second semiconductor chip mounted above the first semiconductor chip, wherein the first and second semiconductor chips are substantially identical in outline and are each rectangular in plan view;
 a thermal interface material pad between the first and second semiconductor chips, the entire thermal interface material pad comprising four portions,
 wherein the first portion and the second portion are shaped as acute isosceles trapezoids and comprise nanofibers aligned substantially only perpendicularly to the parallel sides of the first portion and the second portion, the shorter parallel sides of the first portion and the second portion abutting each other;
 wherein the third portion and the fourth portion are shaped as isosceles right triangles and comprise nanofibers aligned substantially only perpendicularly to the hypotenuses of the third portion and the fourth portion; the right-angled vertices of the third portion and the fourth portion abutting respective ends of the shorter parallel sides of the first portion and the second portion;
 the longer parallel sides of the first portion and the second portion extending to cover respective long edges of the first and second semiconductor chips, and the hypotenuses of the third portion and the fourth portion extending to cover respective short edges of the first and second semiconductor chips.

2. The chip stack of claim 1, wherein the portions of the thermal interface material pads extend beyond the edges of the first and second semiconductor chips, in order to contact heat sinks adjacent to the first and second semiconductor chips.

* * * * *